US012702044B2

(12) United States Patent
Zou et al.

(10) Patent No.: US 12,702,044 B2
(45) Date of Patent: Aug. 4, 2026

(54) SUBSTRATE TRENCH FOR IMPROVED HYBRID BONDING

(71) Applicant: Intel Corporation, Santa Clara, CA (US)

(72) Inventors: Zhihua Zou, Singapore (SG); Omkar Karhade, Chandler, AZ (US); Botao Zhang, Gilbert, AZ (US); Julia Chiu, Portland, OR (US); Vivek Chidambaram, Singapore (SG); Yi Shi, Chandler, AZ (US); Mohit Bhatia, Chandler, AZ (US); Mostafa Aghazadeh, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 89 days.

(21) Appl. No.: 17/854,813

(22) Filed: Jun. 30, 2022

(65) Prior Publication Data

US 2024/0006358 A1     Jan. 4, 2024

(51) Int. Cl.
*H10W 72/90*      (2026.01)
*H10W 99/00*      (2026.01)
*H10W 80/00*      (2026.01)
*H10W 90/00*      (2026.01)

(52) U.S. Cl.
CPC ......... *H10W 72/90* (2026.01); *H10W 80/327* (2026.01); *H10W 99/00* (2026.01); *H10W 72/934* (2026.01); *H10W 80/033* (2026.01); *H10W 80/312* (2026.01); *H10W 80/732* (2026.01); *H10W 90/792* (2026.01)

(58) Field of Classification Search
CPC .................... H01L 24/08; H01L 24/80; H01L 2224/08059; H01L 2224/08145; H01L 2224/80031; H01L 2224/80895; H01L 2224/80896
USPC ........................................................ 257/666
See application file for complete search history.

(56) References Cited

U.S. PATENT DOCUMENTS

| | | | | |
|---|---|---|---|---|
| 7,838,974 | B2 * | 11/2010 | Poddar ................ | H10W 70/411 257/676 |
| 10,649,137 | B1 * | 5/2020 | Preisler ................. | G02B 6/136 |
| 2011/0085760 | A1 * | 4/2011 | Han ........................ | G02B 6/423 385/14 |
| 2014/0319656 | A1 * | 10/2014 | Marchena ............... | H01L 23/13 438/106 |
| 2022/0059499 | A1 * | 2/2022 | Arvin .................. | H01L 25/0655 |
| 2022/0367435 | A1 * | 11/2022 | Hung .................... | H10W 90/00 |
| 2023/0017286 | A1 * | 1/2023 | Zhang ..................... | H01L 21/78 |

* cited by examiner

*Primary Examiner* — Mohammad M Hoque
(74) *Attorney, Agent, or Firm* — Essential Patents Group, LLP

(57)           ABSTRACT

Bonding pedestals on substrates, and their manufacture, for direct bonding integrated circuit (IC) dies onto substrates. The electrical interconnections of one or more IC dies and a substrate are bonded together with the IC dies on and overhanging the pedestals. A bonding pedestal may be formed by etching down the substrate around the interconnections. A system may include one or more such pedestals above and adjacent a recessed surface on a substrate with IC dies overhanging the pedestals. Such a system may be coupled to a host component, such as a board, and a power supply via the host component.

16 Claims, 9 Drawing Sheets

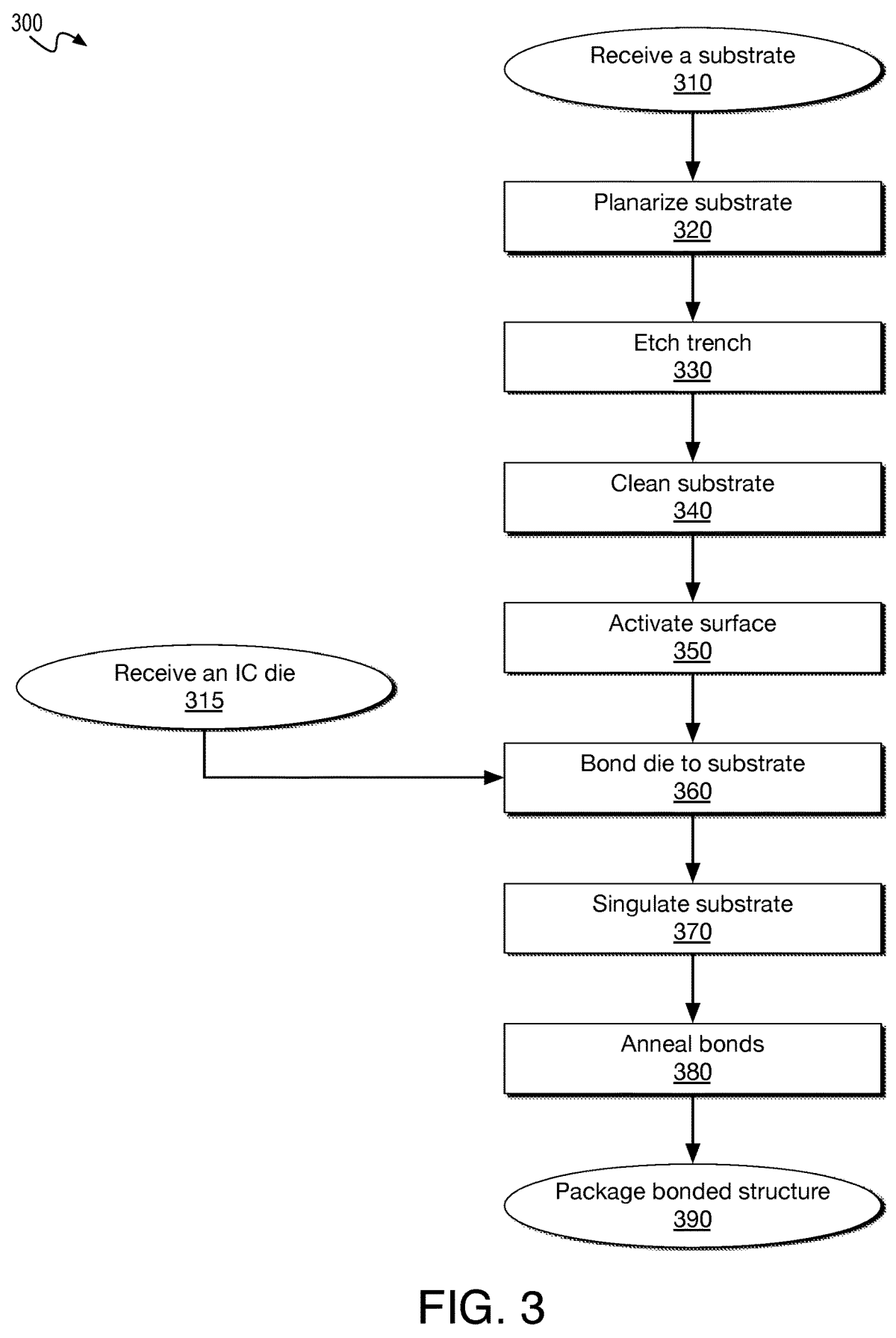

300

Receive a substrate
310

Planarize substrate
320

Etch trench
330

Clean substrate
340

Activate surface
350

Receive an IC die
315

Bond die to substrate
360

Singulate substrate
370

Anneal bonds
380

Package bonded structure
390

FIG. 3

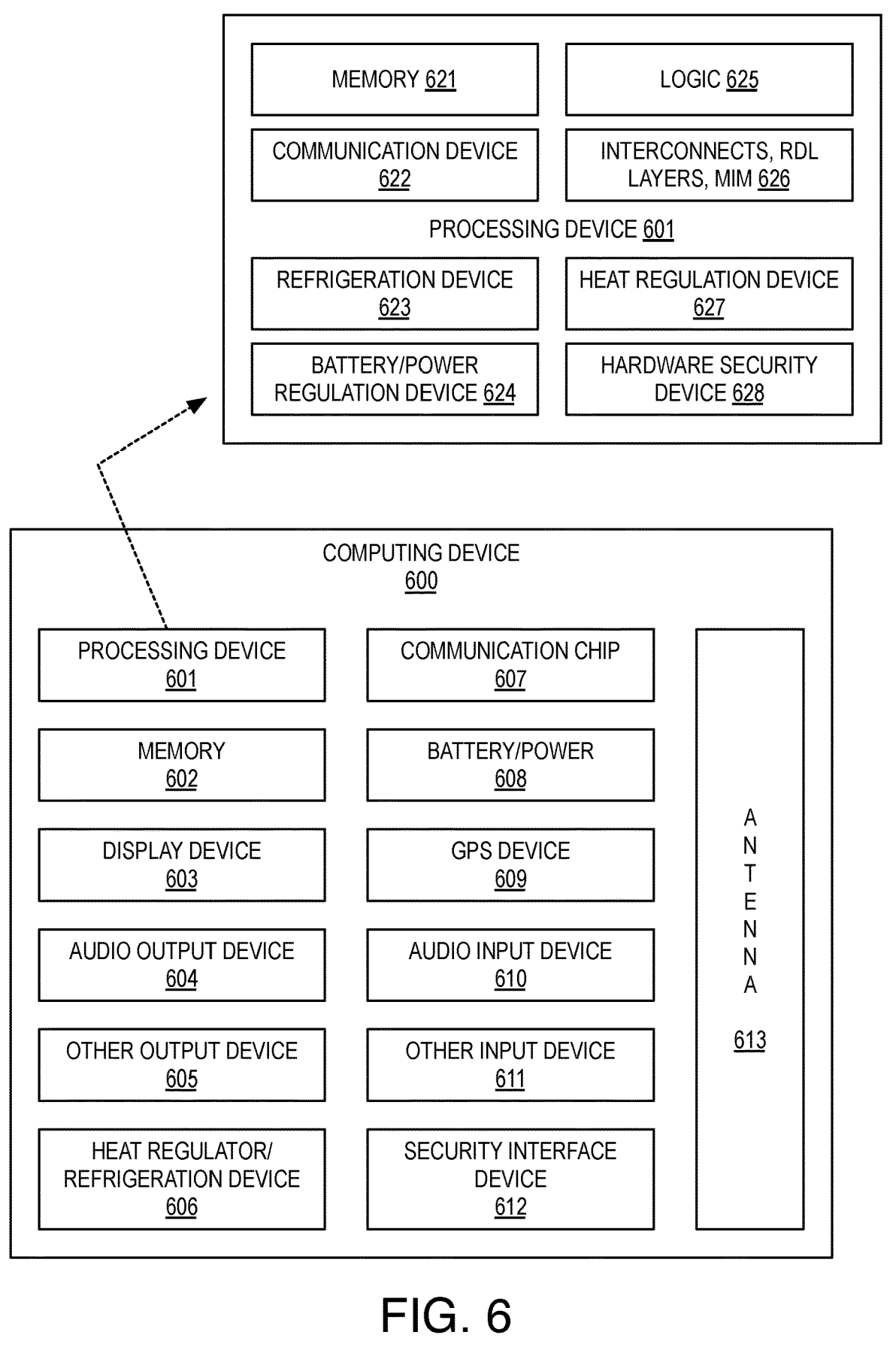

MEMORY 621

LOGIC 625

COMMUNICATION DEVICE 622

INTERCONNECTS, RDL LAYERS, MIM 626

PROCESSING DEVICE 601

REFRIGERATION DEVICE 623

HEAT REGULATION DEVICE 627

BATTERY/POWER REGULATION DEVICE 624

HARDWARE SECURITY DEVICE 628

COMPUTING DEVICE 600

PROCESSING DEVICE 601

COMMUNICATION CHIP 607

MEMORY 602

BATTERY/POWER 608

DISPLAY DEVICE 603

GPS DEVICE 609

AUDIO OUTPUT DEVICE 604

AUDIO INPUT DEVICE 610

OTHER OUTPUT DEVICE 605

OTHER INPUT DEVICE 611

HEAT REGULATOR/ REFRIGERATION DEVICE 606

SECURITY INTERFACE DEVICE 612

ANTENNA 613

FIG. 6

SUBSTRATE TRENCH FOR IMPROVED HYBRID BONDING

BACKGROUND

Surface defects (including foreign materials, particles, and edge chipping), e.g., on component wafers contribute to significant yield loss from poor hybrid bonding of integrated circuit (IC) dies from component wafers to other ICs, e.g., from substrate wafers. Those surface defects can translate into bonding defects of 100 times the size or more of the responsible surface defects, which means that for hybrid bonding interconnections with pitches on the scale of tens of microns the bonding surface needs to be defect-free on the scale of tenths of microns. Tighter pitch designs require even lower defect densities, which creates challenges for manufacturing equipment, processes and metrology. Structures and methods are needed to improve hybrid-bonding yields and resilience to edge defects.

FIG. 1A illustrates cross-sectional profile views of conventional substrate 110 and IC die 120. Substrate 110 includes interconnect interfaces 112, which are to bond to die interconnect interfaces 122. However, a surface defect 140 interferes with the bonding of substrate 110 to IC die 120 and the bonding of substrate interconnect interfaces 112 to die interconnect interfaces 122. Surface defect 140 hinders a substantially planar joining of the surfaces of IC die 120 and substrate 110 and may cause a void 141 between the bonding surfaces.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements, e.g., with the same or similar functionality. The disclosure will be described with additional specificity and detail through use of the accompanying drawings:

FIG. 3 illustrates methods for bonding an IC die to a substrate, including etching a trench in the substrate, in accordance with some embodiments;

FIG. 6 is a block diagram of an example computing device, in accordance with some embodiments.

DETAILED DESCRIPTION

Figure 1A:
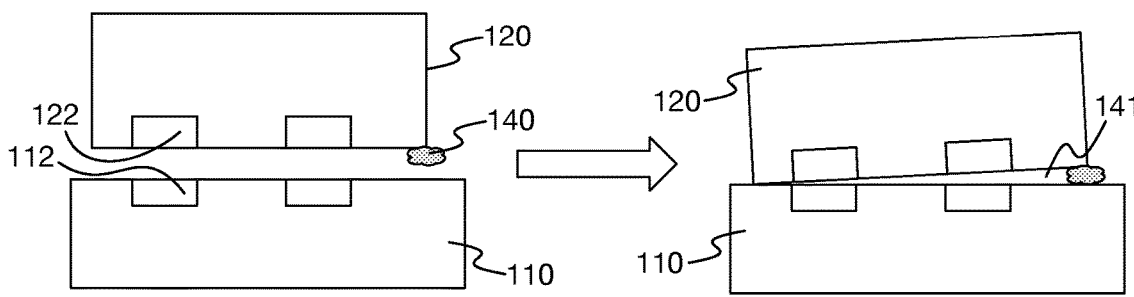
FIG. 1A illustrates cross-sectional profile views of an IC die and a substrate, in accordance with convention.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter.

References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "coupled" and "connected," along with their derivatives, may be used herein to describe structural relationships between components. These terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and recitations of "top," "bottom," "above," and "below" refer to relative positions in the z-dimension with the usual meaning. However, embodiments are not necessarily limited to the orientations or configurations illustrated in the figure.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed to improve the quality of direct bonding of integrated circuit (IC) dies to other substrates and the yields of these bonded structures. The surface of a substrate can be recessed, for example with a trench etch process, to improve resilience to surface defects. Hybrid bonding involves the direct bonding of IC dies and substrates, including the bonding of their respective interconnect interfaces, e.g., bond pads, and adjacent dielectric material interfaces. Such direct bonding techniques rely on the bonding surfaces being very clean and having a high degree of planarity. With direct bonding, one or more IC dies (e.g., chiplets) may be bonded to a substrate, which can be, e.g., a larger or similarly sized IC die in singulated form after dicing or in wafer form before dicing.

As described further below, bonding defects, such as voids, can be prevented by creating a trench, e.g., within a periphery of a bonding surface that will leave a gap between an edge of a bonded IC die and the host substrate. Such a trench can be sized and situated within a portion of the substrate or IC die so there is a gap to accommodate a typical size distribution and area density of surface defects. Surface defects within the area of the trench and/or within an overhang of, e.g., the IC die will then be less likely to impede intimate contact between die and substrate bonding surfaces. The horizontal and vertical dimensions of a trench (and the substrate and IC die) can also be predetermined to account for die-to-die spacing, a top-layer dielectric thickness, a metallization density around the trench the impact of the trench dimension on wafer utilization, etc. Optionally, an IC die area can be increased to create space between interconnection structures and die edges for accommodation of a substrate trench.

Figure 1B:
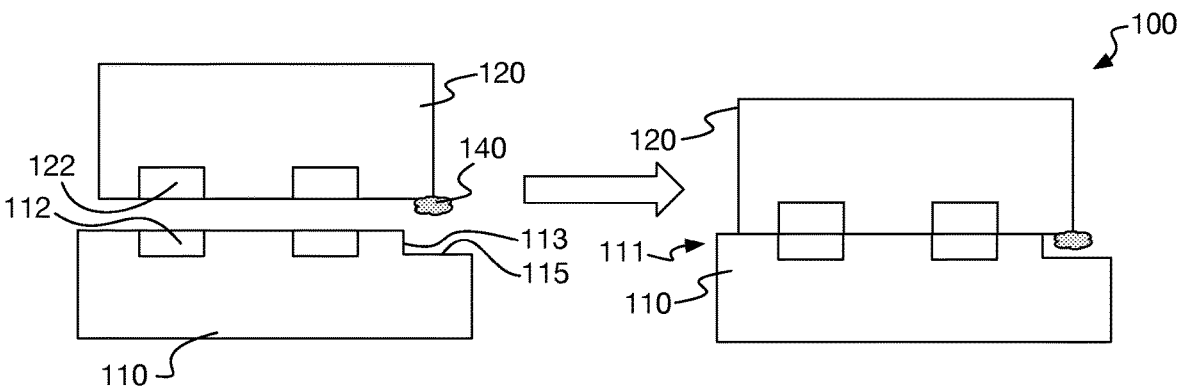
FIG. 1B illustrates cross-sectional profile views of an IC device with a substrate and IC die, in accordance with some embodiments.
Figure 1B:
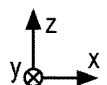

FIG. 1B illustrates cross-sectional profile views of an IC device 100 with substrate 110 and IC die 120, in accordance with some embodiments. In FIG. 1B, substrate 110 has a trench or recess that defines at least one side of a pedestal 111. A pedestal sidewall 113 delimits pedestal 111 and a recessed trench surface 115 below pedestal 111. IC die 120 overhangs recessed trench surface 115 on at least one side of pedestal 111. When substrate 110 and IC die 120 are brought together, surface defect 140 does not interfere with the bonding of substrate 110 to IC die 120. Surface defect 140, on an edge of IC die 120, overhangs recessed trench surface 115 and does not prevent flush contact between IC die 120 and substrate pedestal 111. The substantially planar joining of IC die 120 and substrate 110 enables the bonding of substrate interconnect interfaces 112 on pedestal 111 and die interconnect interfaces 122.

Recessed trench surface 115 is wide enough for IC die 120 to overhang recessed trench surface 115 far enough to prevent surface defect 140 from interfering with the bonding of substrate 110 and IC die 120. The inventors have noted that a majority of surface defects 140 are often near die edges, having been generated, for example, by a die singulation process or by pick and place tools that contact the edges of IC dies. Accordingly, IC die 120 may overhang recessed trench surface 115 by 1 μm, or more, as a function of a probability function characterizing a frequency distribution of particles as a function of distance from the edge of IC die 120. In embodiments where surface defects travel greater distances from the edge, IC die 120 should overhang recessed trench surface 115 by a greater amount, for example by at least 2 μm.

Relative to a top surface of pedestal 111, recessed trench surface 115 is deep enough, i.e., sidewall 113 is tall enough, to prevent surface defect 140 from interfering with the bonding of substrate 110 and IC die 120.

Figures 2A, 2B, 2C:
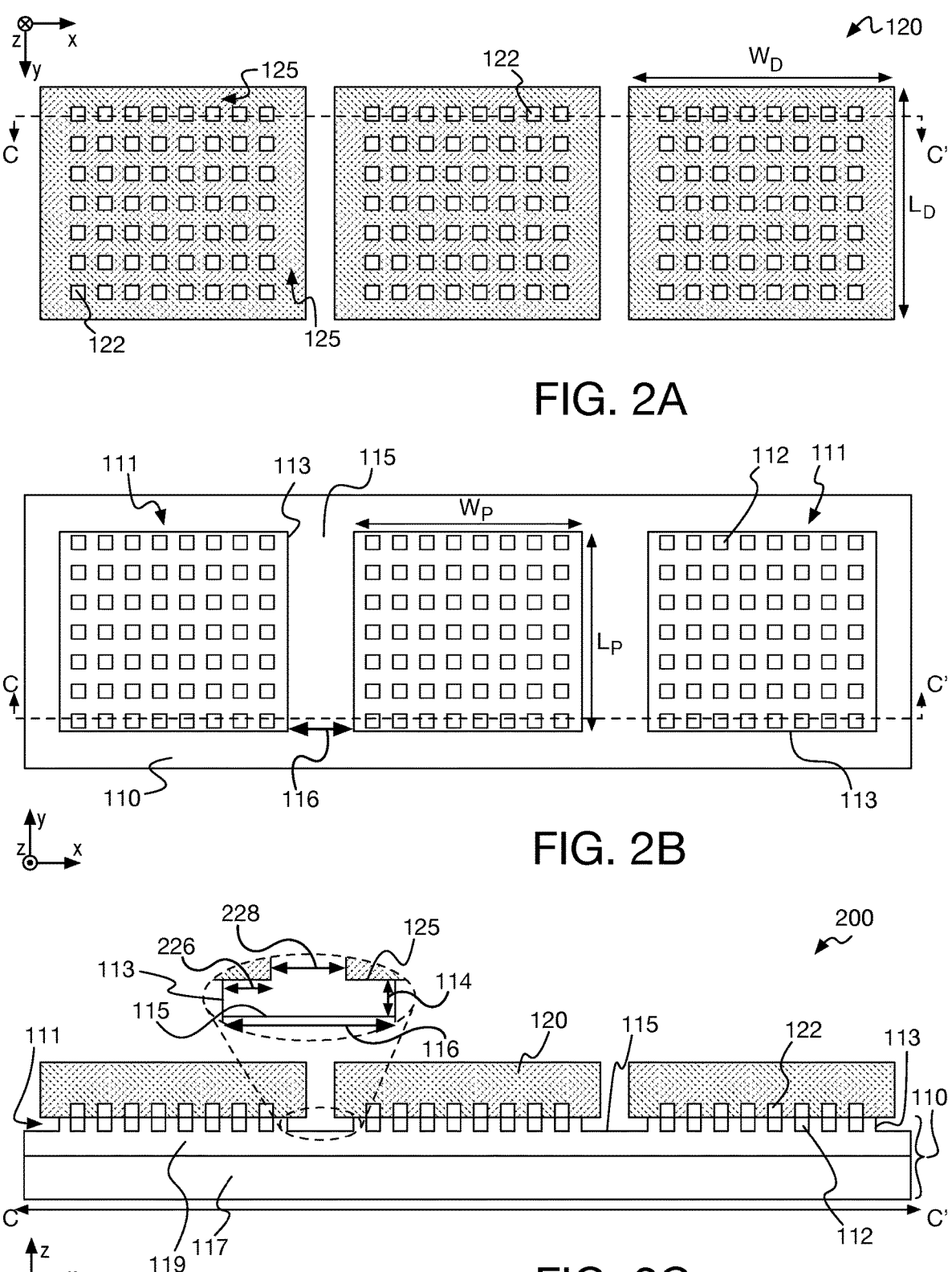
FIGS. 2A, 2B, and 2C illustrate plan and cross-sectional side views of multiple IC dies and a substrate as components of a multi-chip module, in accordance with some embodiments.

FIGS. 2A, 2B, and 2C illustrate plan and cross-sectional side views of multiple IC dies 120 and a substrate 110 as components of a multi-chip module 200, in accordance with some embodiments. FIGS. 2A and 2B show plan views of the bonding surfaces of components of the bonded multi-chip module 200 of FIG. 2C, for example prior to their bonding. FIG. 2A shows a plan view of three IC dies 120, including die interconnect interfaces 122, and the cross-sectional view line C-C'. FIG. 2B shows a plan view of substrate 110, including substrate interconnect interfaces 112 on three pedestals 111, and the cross-sectional view line C-C'. FIG. 2C shows a cross-sectional side view C-C' of multi-chip module 200, including three IC dies 120 on pedestals 111 above recessed trench surface 115 of substrate 110.

As shown in FIG. 2A, each IC die 120 has an array of die interconnect interfaces 122 in an interior portion of the die area. Periphery portion 125 of each IC die 120 is adjacent to die interconnect interfaces 122 and extends to the edges of IC dies 120. A die width W D of IC dies 120 is shown measured in the x direction, and a die length L D of IC dies 120 is shown measured in the y direction.

IC dies 120 have one or more die interconnect interfaces 122 for bonding to complementary substrate interconnect interfaces 112. The IC dies 120 shown in FIG. 2A have substantially identical areas and arrays of die interconnect interfaces 122, but IC dies 120 may have different die areas, as embodiments are not limited in this respect. In some embodiments, IC dies 120 have different functions and different layouts. Although three IC die 120 are illustrated as bonded to one substrate 110, any non-zero integer number of die may be bonded to a substrate.

In some embodiments, IC die 120 includes crystalline material, such as silicon. In some embodiments, IC die 120 includes dielectric materials, such as $SiO_2$. IC die 120 may have surface defects, e.g., near the die edges, some in periphery portion 125. Such defects can result from dicing operations or other causes, e.g., mishandling, etc. As will be discussed below, IC die 120 can be laid out with increased dimensions to move such defects away from die interconnect interfaces 122. IC die 120 can be trenched to keep surface defects from interfering with direct bonding of IC die 120 with substrate 110.

As shown in FIG. 2B, pedestals 111 have sidewalls 113 and trenches on all sides. Perimeters of pedestals 111 are all surrounded by recessed trench surface 115. Pedestals 111 are separated by recessed trench surface 115, which is below pedestals 111. Arrays of substrate interconnect interfaces 112 are on the tops of three pedestals 111 and mirror the arrays of die interconnect interfaces 122 seen on IC dies 120 in FIG. 2A. A trench width 116 spans the entirety of a lateral distance between pedestals 111. A width $W_P$ of pedestals 111 is shown measured in the x direction, and a length $L_P$ of pedestals 111 is shown measured in the y direction. While the arrays of interconnect interfaces 112, 122 have identical dimensions, $W_D > W_P$ and $L_D > L_P$, i.e., IC dies 120 are both wider and longer than pedestals 111.

Substrate 110 is a planar platform and may include dielectric and metallization structures. Substrate 110 mechanically supports and electrically couples one or more IC dies 120. At least one side of substrate 110 includes substrate interconnect interfaces 112 for direct bonding to one or more IC dies 120. The opposite side of substrate 110 may include similar interfaces or, e.g., copper pads for socketing or solder bumps for bonding the package to a printed circuit board. Substrate 110 may be any host component with substrate interconnect interfaces 112, such as a package substrate or interposer, another IC die, etc. Substrate 110 may itself be a die. Substrate 110 may bond to any host component, such as a package substrate or interposer, another IC die, etc. In some embodiments, substrate 110 includes a crystalline material, such as silicon. Substrate 110 might be in singulated chip form, in wafer form, or in another form. In some embodiments, substrate 110 is part of a wafer including many other similar substrates.

Interconnect interfaces 112, 122 electrically couple any circuitry in IC dies 120 with circuitry in substrate 110. Interconnect interfaces 112, 122 can be any suitable structures. Advantageously, interconnect interfaces 112, 122 have low resistivity, including low contact resistance for making satisfactory electrical connection. Also advantageously, interconnect interfaces 112, 122 are of a material, size, and shape suitable for making direct contact with each other. In some embodiments, interconnect interfaces 112, 122 are pads or pillars, e.g., comprising copper and with approximately matching layouts. Other metals or non-metals (e.g., graphite) can be used.

As shown in FIG. 2C, each of IC dies 120 make flush contact with corresponding ones of pedestals 111. IC dies 120 and pedestals 111 in this example are completely surrounded on all sides by recessed trench surface 115, which is between and around pedestal sidewalls 113. As shown, substrate interconnect interfaces 112 are in direct contact with die interconnect interfaces 122.

The perspective and magnified inset portion of FIG. 2C emphasizes the differences in sizes between IC dies 120 and pedestals 111, and shows some dimensions in greater detail. A pedestal or sidewall height 114 of sidewall 113 is measured from recessed trench surface 115 to IC die 120 on top of a pedestal 111. An overhang dimension 226 is a measure of a lateral distance IC die 120 extends beyond a side of its pedestal 111 to the die's edge, i.e., the lateral width of periphery portion 125 that is over recessed trench surface 115. As shown, trench width 116 is a lateral width of recessed trench surface 115 between two pedestals 111. An inter-die distance 228 is a lateral distance between two IC dies 120 over a trench.

Because IC dies 120 are wider than pedestals 111, i.e., $W_D > W_P$, periphery portions 125 provide space between die sidewalls (or edges) and the sides of pedestals 111. Since $W_D > W_P$, IC dies 120 overhang recessed trench surface 115 on both sides in the x direction. Larger periphery portions 125 result in larger overhang dimensions 226 beyond pedestals 111 and over recessed trench surface 115. The dimensions of IC die 120 can be increased to improve hybrid bonding by moving, e.g., edge defects away from interconnect interfaces 112, 122. For example, W D and/or L D can be increased to widen periphery portion 125 and increase overhang dimension 226. This increased distance between die interconnect interfaces 122 and die edges can accommodate a larger area density of surface defects. In some embodiments, IC die 120 is lengthened in at least one dimension (i.e., W D or L D is larger), periphery portion 125 is wider in at least that dimension, and the surface defects are all within periphery portion 125 (although they are the same distance from the die edges). In some embodiments, overhang dimension 226 is 10 µm on at least one side. In other embodiments, overhang dimension 226 is 15 µm. Trenches in substrate 110 can be wherever needed to ensure surface defects do not interfere with flush contact between pedestals 111 and top IC dies 120. In some embodiments, a majority of surface defects on IC dies 120 occur within 1 µm of the die edges. In some such embodiments, overhang dimension 226 is 2 µm. In other embodiments, overhang dimension 226 is 5 µm.

Trench width 116 is a function of inter-die distance 228 and overhang dimensions 226 and must be wide enough to accommodate them both, including two overhang dimensions 226 in some cases. This width must include any manufacturing tolerances necessary to keep IC dies 120 from unintentionally contacting other nearby IC dies 120. To minimize substrate size and increase wafer utilization rate, inter-die distance 228 can be minimized. In some embodiments, inter-die distance 228 is 2 µm and trench width 116 is 20 µm or more. Additional space may be provided to accommodate a package dielectric (not depicted), for example, or other manufacturing considerations. In some embodiments, inter-die distance 228 is larger and trench width 116 is 40 µm.

Substrates 110 with deeper trenches, i.e., taller sidewall heights 114, provide resilience against hybrid-bonding interference by larger surface defects. In some embodiments, substrates 110 have sidewall heights 114 of 1 µm. In some embodiments where a majority of surface defects 140 are at least 1 µm in diameter, sidewall height 114 is larger than 1 µm, for example 2 µm, or more. In other embodiments where most surface defects 140 are smaller, sidewall height 114 may be 1 µm, or less (e.g., 0.5 µm, etc.). Sidewall height 114 can be larger or smaller than overhang dimension 226. For embodiments with defects having arbitrary geometries and/ or dimensions approximately equal in all directions, overhang dimension 226 may be at least as long as sidewall height 114 is tall, e.g., to accommodate defects near but not at a die edge.

A trench can extend into and through multiple layers of substrate 110. Two layers of substrate 110 are shown in FIG. 2C, an upper layer 119 and a lower layer 117. Recessed trench surface 115 is within upper layer 119, but can have any depth needed to accommodate defects of a certain size distribution. In some embodiments where surface defects are smaller, recessed trench surface 115 is less deeply within upper layer 119. In some embodiments, upper layer 119 and lower layer 117 are dielectric layers. In other embodiments, upper layer 119 is a dielectric layer and lower layer 117 is a crystalline material, such as silicon. In some embodiments, trench depths are limited to within subsurface circuit material layers of substrate 110. In some such embodiments, recessed trench surface 115 is within a dielectric layer of substrate 110. As deeper trenches can facilitate bonding in the presence of larger surface defects, in some embodiments, recessed trench surface 115 is within an underlying lower layer 117. In some such embodiments, recessed trench surface 115 is within a layer of crystalline material. In some such embodiments, the crystalline material is silicon.

FIG. 3 illustrates methods for bonding an IC die to a substrate, including etching a trench in the substrate, in accordance with some embodiments. FIG. 3 shows methods 300 that includes operations 310-390. Some operations shown in FIG. 3 are optional. FIG. 3 shows an example sequence, but the operations can be done in other sequences as well, and some operations may be omitted. Some operations can also be performed multiple times before other operations are performed. For example, if multiple dies are being bonded to a substrate, one or more of operations 310-360 may be repeated until the substrate is bonded with all of the IC dies before annealing the bonded structure. Some operations may be included within other operations. Methods 300 generally entail preparing one or both of die and substrate surfaces for bonding by etching a trench in at least the substrate. The die and substrate are bonded and singulated, and an insulating material is applied over at least some of the bonded structure.

FIGS. 4A, 4B, 4C, 4D, 4E, and 4F illustrate isometric views of an IC device, including IC dies 120 and substrate 110, at various stages of manufacture, in accordance with some embodiments. As shown in FIGS. 4A-4E, substrate 110 and IC dies 120 are received and bonded to form multi-chip module 200, which is packaged and singulated, e.g., by laser scribe. A trenching operation improves the bonding of substrate 110 and IC dies 120.

Returning to FIG. 3, a substrate is received in operation 310. An IC die is received for bonding to the substrate in operation 315. The IC die may be received after other operations in FIG. 3, e.g., trenching, cleaning, activation, etc., but before bonding. Other operations in FIG. 3, e.g., trenching, cleaning, activation, etc., may be performed on the IC die before it is received. Both the substrate and IC die have interconnect interfaces, at least some of which will be bonded together. In some embodiments, multiple IC dies are received for bonding to the substrate, and some base interconnect interfaces on the substrate are bonded to interconnect interfaces on one die and other base interconnect interfaces are bonded to interconnect interfaces on one or more other dies. In some embodiments, the multiple IC dies are the same or similar, e.g., having the same functions and identical arrays of interconnect interfaces. For example, multiple memory dies with identical layouts may be bonded to the substrate or stacked one on top of another. In some such embodiments, the final dimensions of the substrate after singulation are the same as for the IC die bonded to it. A substrate may be an IC die that, in another embodiment, is bonded to another substrate.

The condition of the received substrate may influence whether other operations in FIG. 3 are performed. In some embodiments, a substrate may be received with interconnect interfaces already on bonding pedestals, proud of a recessed surface, i.e., raised above and surrounded by the recessed surface. In some such examples, etching a trench may be omitted. A received substrate may be an IC die already singulated (e.g., sawn, laser diced, etc.) from a wafer. In some such embodiments, scribing or sawing a substrate may be omitted, as well as any other operations that have already been performed upstream of methods 300 (e.g., when the substrate was part of a larger wafer).

Figure 4A:
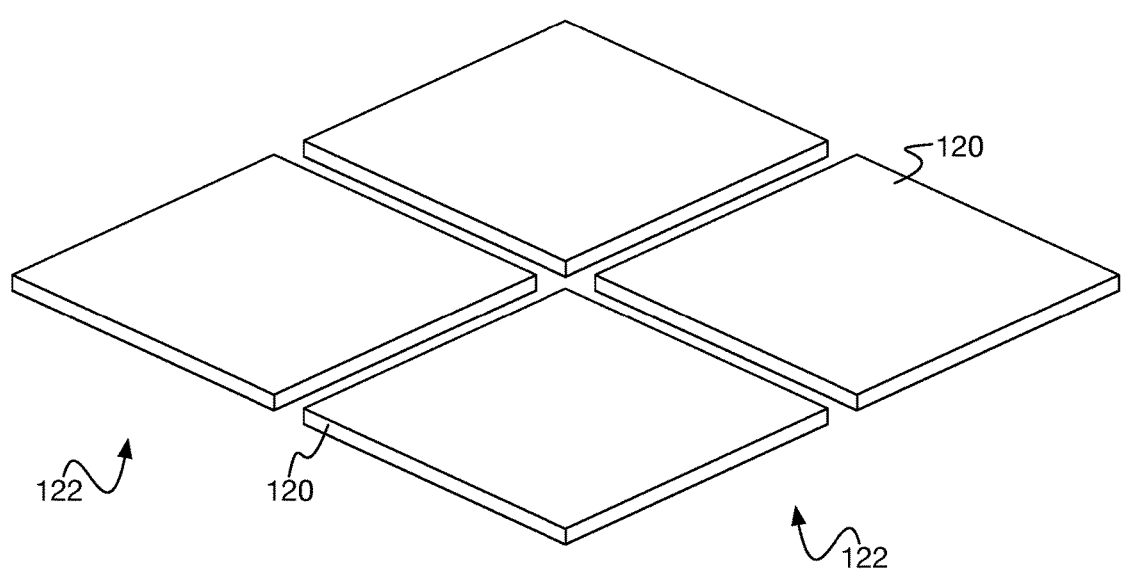
FIGS. 4A, 4B, 4C, 4D, 4E, and 4F illustrate isometric views of an IC device, including IC dies and a substrate, at various stages of manufacture, in accordance with some embodiments.
Figure 4A:
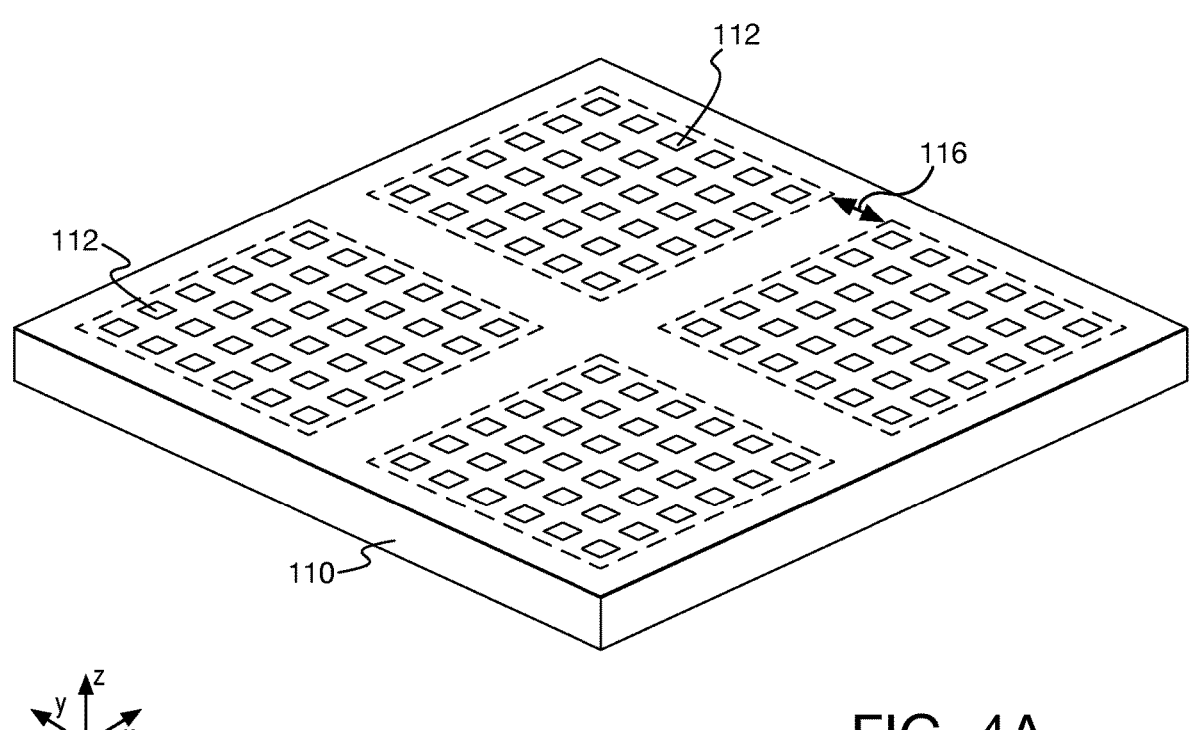
Figure 4A:

FIG. 4A shows an example received substrate 110 and four IC dies 120 to be bonded to it. A plurality of substrate interconnect interfaces 112 are on substrate 110, an array of substrate interconnect interfaces 112 for each of the four IC dies 120. Each of four IC dies 120 have a plurality of die interconnect interfaces 122 (not shown).

Dashed lines indicate where trenches may be etched into substrate 110, between and around the arrays of substrate interconnect interfaces 112. A trench width 116 shows the lateral distance that may be between pedestals that the trenching forms.

In some embodiments, all IC dies 120 will couple with substrate 110 to form a single multi-chip module. In other embodiments, IC dies 120 will join with substrate 110 and later be separated to form two multi-chip modules, each with two IC dies 120. Substrate 110 may be bonded with any number of IC dies 120. For example, substrate 110 may be a wafer with many thousands of arrays of substrate interconnect interfaces 112, only four of which are shown in FIG. 4A. Substrate 110 may be bonded to another substrate below it. For example, when fully assembled, substrate 110 may be an IC die with at least a die above and below it in a stack of IC dies in a multi-chip module. In other embodiments, at least some of the IC dies 120 have different sizes and layouts of interconnect interfaces 122. For example, multiple IC dies 120 with different functions (e.g., logic, memory, etc.) may be bonded onto substrate 110 with interconnections between IC dies 120. In some embodiments, IC dies 120 with different functions have same or similar dimensions and interconnect layouts.

Returning to FIG. 3, the surface of substrate may be planarized in operation 320, e.g., by a CMP process or any planarization technique known to be suitable. Planarization, may prepare interconnect interfaces for bonding. Subsequent etching of a trench in the substrate may also be improved by first planarizing the bonding surface of the substrate to a uniformly flat surface.

In operation 330, one or more trenches are etched in the substrate adjacent an array of interconnect interfaces. The etching reveals one or more recessed surfaces adjacent to and below a pedestal that includes the interconnect interfaces. The one or more recessed surfaces can be on one or more sides of, and may completely surround, a pedestal. The pedestal includes a portion of the substrate surface having an array of interconnect interfaces where an array of interconnect interfaces of an IC die may contact the substrate. A trench along one side of the pedestal can be useful when coupling a substrate to an IC die with a prevalence for surface defects along an edge of the die. In some embodiments, the IC die contacts the substrate such that the edge with frequent surface defects overhangs the recessed surface.

In embodiments with multiple IC dies bonding to a substrate, a trench is etched in the substrate at least between the interconnect interfaces meant to interconnect with each die, and a pedestal with interconnect interfaces is formed for each of the dies with one or more recessed surfaces between them. In some embodiments, the interconnect interfaces of two IC dies bond to interconnect interfaces on a substrate, each with interconnect interfaces on separate pedestals with a recessed surface between them.

The substrate may be etched by any suitable means. Advantageously, such etch processes should not generate edge defects that might cause bonding defects or yield issues. For example, a dry etch procedure, such as reactive ion etching (RIE), may form the bonding pedestal and reveal a recessed surface. In some embodiments, the trench is patterned by depositing a masking substance, e.g., a nitride, over the interconnect interfaces on the substrate, and the recessed surface is revealed by plasma etching the substrate adjacent to the interconnect interfaces. In some such embodiments, a deep RIE (DRIE) recesses the substrate surface. A wet etch can also be used with similar masking over the interconnect interfaces on the substrate. A laser ablation process may also be practiced.

In those embodiments where the substrate is part of a wafer including many similar substrates, the revealed recessed surface between pedestals on adjacent substrates will generally be wider than a kerf etch. For example, if the substrate is singulated, e.g., sawn, from the wafer along the recessed surface, the trench etch enables a region of the substrate between a pedestal and a die edge to remain, underhanging below an overhanging IC die.

Figure 4B:
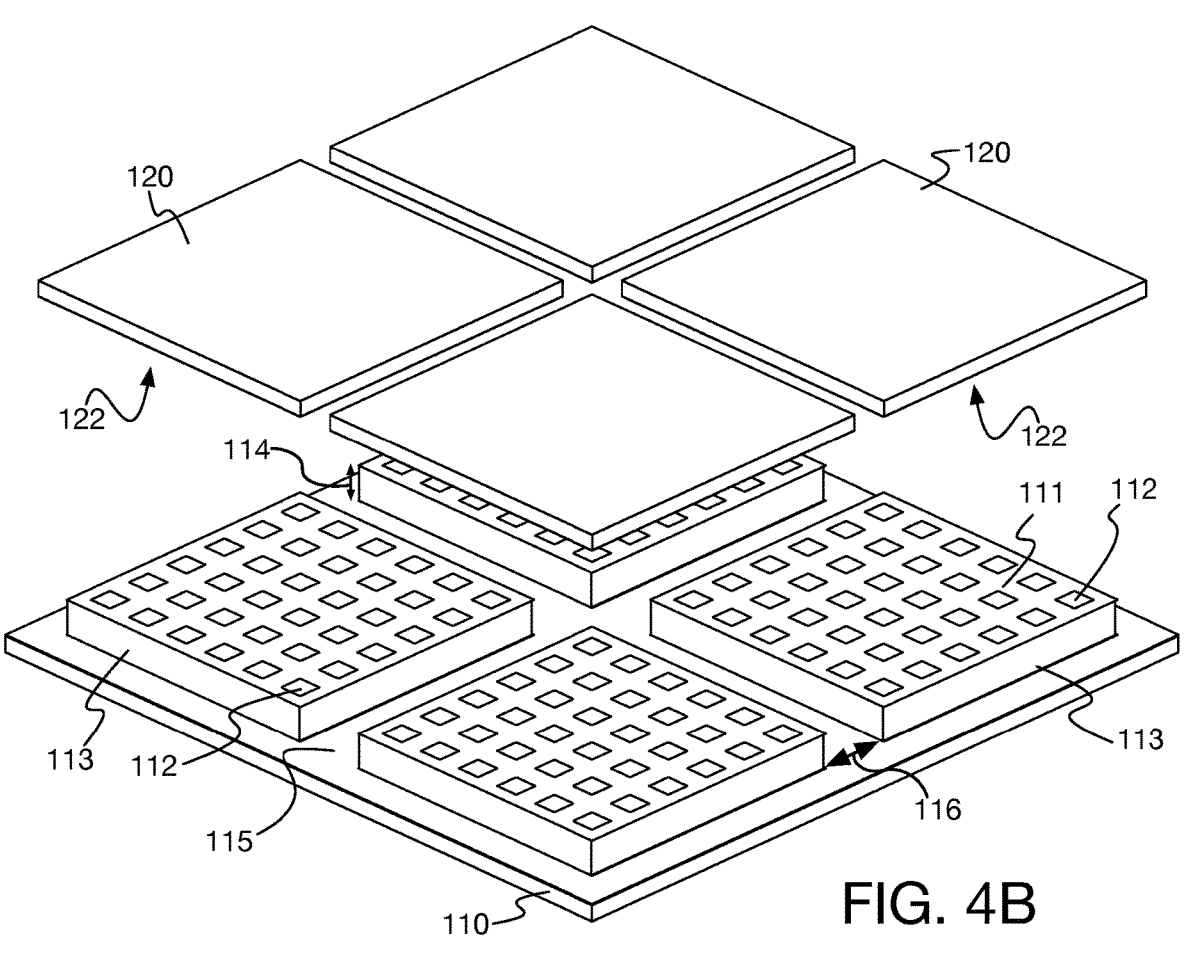

FIG. 4B shows the example of FIG. 4A after trenches have been etched in substrate 110. The four arrays of substrate interconnect interfaces 112 are seen on substrate 110, now on pedestals 111, with the substrate interconnect interfaces 112 separated by recessed trench surface 115. The four top IC dies 120 and their arrays of die interconnect interfaces 122 (on IC die 120 undersides, not shown) can bond with substrate 110, each at a pedestal 111 with an array of substrate interconnect interfaces 112. Recessed trench surface 115 delimits the trenches at their bottoms, and pedestal sidewalls 113 delimit the trench sides. Sidewall heights 114, the vertical distance of pedestals 111 above recessed trench surface 115, are also measures of the depths of the trench etches. Trench width 116 is the lateral width of recessed trench surface 115 between pedestals 111 and may vary for different pairs of pedestals 111.

Returning to FIG. 3, in preparation for bonding, the substrate is cleaned in operation 340, generally by a wet chemical cleaning procedure. By removing debris or contaminants that would interfere with the bonding, cleaning the bonding surfaces can improve bond strength also. Advantageously, the substrate is cleaned after etching trenches in the substrate. Additionally or in the alternative, the substrate may be cleaned before etching trenches in the substrate. Cleaning after etching (and, generally, having fewer intervening operations between cleaning and bonding) has the benefit of removing potential debris (and not adding more) before bonding.

A substrate may be cleaned by any means. Multiple procedures may be used in combination. Water may be deionized to remove impurities before a wafer soak and cleaning operations. Some embodiments use a high-pressure water cleaning operation, sometimes following a plasma clearance operation. A visibly contaminated substrate may benefit from a preliminary clean in solutions targeting the particular contaminants. For example, a mixture of sulfuric acid and hydrogen peroxide may remove organic residues. In some embodiments, aqueous ammonia is mixed with hydrogen peroxide instead of sulfuric acid. In some embodiments, both mixtures are used sequentially. Other cleaning procedures use a first clean to remove particles and organic contaminants before a second clean removes metallic contaminants. The first clean may use a mixture of aqueous ammonia and aqueous hydrogen peroxide (in deionized water), and the second clean may use a mixture of aqueous hydrochloric acid and aqueous hydrogen peroxide. Some such embodiments employ a brief bath in a dilute solution of hydrofluoric acid between the first and second cleans. Advantageously, the substrate may be cleaned before an operation activating the substrate surface.

A surface activation operation 350 prepares the substrate for direct bonding. Surface activation before bonding may improve bond strength or enable a reduced anneal temperature and length used to strengthen the bonding. The surface preparation increases the surface energy for bonding the substrate and IC die, including bonding of their respective interconnect interfaces. There may be overlap with surface activation and other operations. For example, surface activation may clean substrate surfaces, and planarizing and cleaning operations may activate a substrate surface. Surface activation operations generally refer to dry cleaning and can be used to remove, e.g., native oxides and adsorbed contaminants.

Surface activation may be by, e.g., UV/ozone cleaning, fast-atom bombardment, or plasma treatments, etc. Plasma activation uses high-voltage and high-frequency stimulation of selected process gases to form a plasma and bombard the substrate surface, often with ions.

In bonding operation 360, the IC die is bonded to the substrate by contacting the IC die to the substrate pedestal, including by contacting the interconnect interfaces of the IC die to the interconnect interfaces on the substrate pedestal. The bonding begins as soon as the die and substrate surfaces are brought into contact, even at room temperature, provided the surfaces are sufficiently flat, smooth, and clean. After contact, even at room temperature, die-to-substrate bond strength improves as more bonds form at the atomic level. Because the bonding begins immediately after contact, bonding operation 360 may include aligning the respective interconnect interfaces before contact is made between the surfaces. Bond strength may be further improved by an annealing operation 380.

Embodiment parameters, e.g., the materials to be bonded and surface preparations used, can determine the type of bonds formed between the bonding surfaces. For example, with silicon-silicon bonding, the bonding depends on whether the bonding surfaces are hydrophobic or hydrophilic, which can be controlled by pre-bonding operations, e.g., cleaning or surface activation. In some embodiments, hydrophilic substrates with native oxides are bonded in air or vacuum. In some such embodiments with silicon substrates, silanol groups react to form water and a silicon oxide.

In some embodiments, the substrate is an IC die and the die received in operation 315 (e.g., a top die) is bonded to the substrate (e.g., a base die) by aligning and contacting the top die and its interconnect interfaces to a pedestal and its interconnect interfaces on the base die. In some embodiments, the substrate is still part of a wafer having many other similar substrates. In some such embodiments, the one or more IC dies received in operation 315 are bonded to the substrate individually by aligning and contacting each IC die and its interconnect interfaces to a pedestal and its interconnect interfaces on the substrate. In embodiments with a substrate as part of a wafer, the one or more IC dies received in operation 315 may be bonded to the substrate en masse by aligning and contacting IC dies and their respective interconnect interfaces to pedestals and interconnect interfaces on the substrate. In some such embodiments, many IC dies are bonded to many substrates across the entirety of the wafer. These IC dies may come from a single wafer or from different wafers.

Figure 4C:
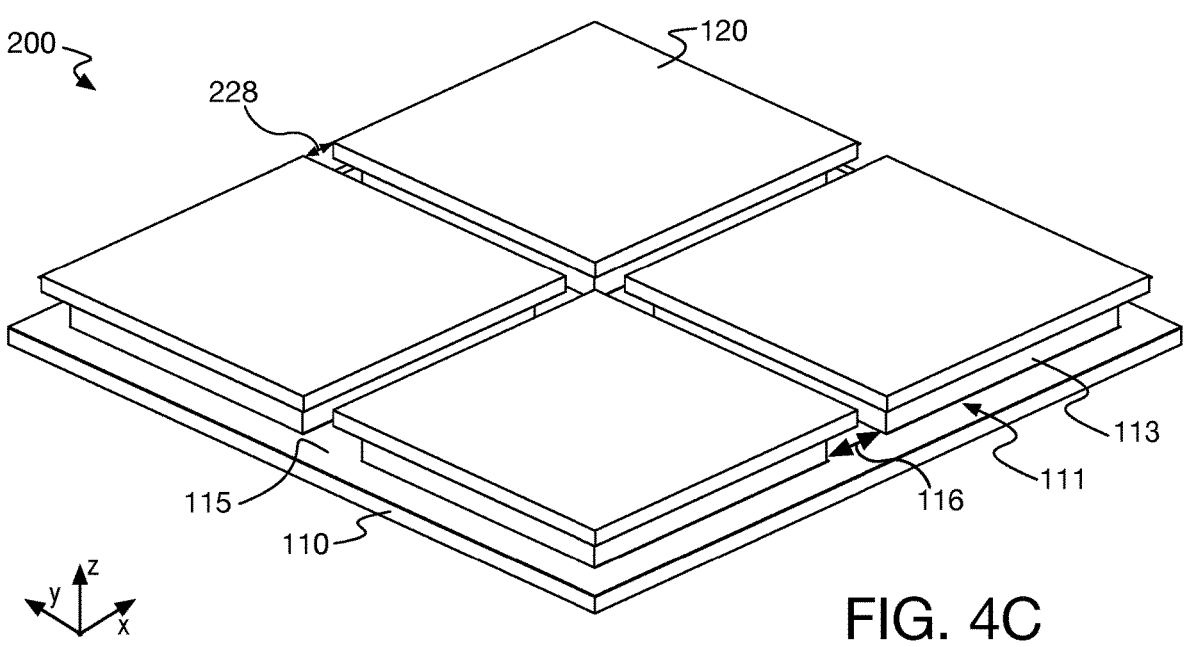

FIG. 4C shows the example of FIGS. 4A and 4B after IC dies 120 have been bonded to substrate 110. The base interconnect interfaces on pedestals 111 are aligned with the top interconnect interfaces on IC dies 120, and the four IC dies 120 are connected to their respective pedestals 111.

Recessed trench surface 115, adjacent and surrounding the four pedestals 111, is between and around four IC dies 120. All four IC dies 120 have wider widths, longer lengths, and larger areas than those of pedestals 111. Portions of all four IC dies 120 extend beyond the perimeters of pedestals 111 on all sides, beyond the four sidewalls of pedestals 111 such that four IC dies 120 overhang recessed trench surface 115. All four pedestals 111 are spaced apart from nearest pedestals 111 by trench widths 116, and recessed trench surface 115 spans the entire trench width 116.

In the examples of FIG. 4C, trench widths 116 between pedestals 111 are the same, e.g., 30 μm, on each side of substrate 110. Trench widths 116 may be varied as necessary, e.g., to allow for IC dies 120 with different widths or lengths or wider periphery portions. In some embodiments, a trench width 116 between first and second pedestals 111 is 40 μm, and a trench width 116 between first and third pedestals 111 is 30 μm. Inter-die distance 228 may likewise be varied as necessary, e.g., to allow for IC dies 120 or recessed trench surfaces 115 with different dimensions. In some embodiments, an inter-die distance 228 between first and second IC dies 120 is 2 μm, and an inter-die distance 228 between first and third IC dies 120 is 10 μm.

Returning to FIG. 3, the substrate may be separated into smaller portions, or from a larger substrate, e.g., a wafer, in a singulation operation 370. Multiple procedures are available for singulating, i.e., dicing, the substrate. In some embodiments, one or more mechanical saws, e.g., having blades with diamond particles, cuts through the entire thickness of the substrate. In some such embodiments, cuts are made on all four sides of the substrate. In other embodiments, one or more laser saws are used to cut through the substrate. Some singulation operations use mechanical loading or force to fracture through the substrate after scribing or cutting through part of the substrate thickness. In some embodiments, the substrate is laser scribed, i.e., a pulsed laser forms defect regions within the substrate thickness to guide subsequent fracture under mechanical loading. In some embodiments, plasma dicing is used, e.g., a DRIE, instead of a laser or mechanical blade.

The dicing may, but need not, coincide with the trenches etched to define substrate bonding pedestals. For example, the dicing (whether by sawing, scribing, etc.) may cut through a portion, but not all, of a recessed substrate surface rendered by the trench etch. In some embodiments, dicing does not cut through the recessed surface. In other embodiments, dicing cuts only through the recessed surface. In other embodiments, the dicing is by laser scribing and scribes through the recessed surface formed by the trench etch. In some embodiments, the dicing is by laser scribing and is adjacent one or more pedestals. In other embodiments, the dicing is separated from the pedestals by a portion of the recessed surface. In some embodiments, the dicing is at least partially through crystalline material of the substrate. In some embodiments, the dicing is through crystalline material and, e.g., dielectric material overlying the crystalline material. In some such embodiments, the dicing is through multiple layers of such dielectric material.

Multiple singulation operations may be performed. For example, IC dies may be diced before they are received in operation 315. Some substrates are diced before, e.g., bonding, and then further singulated after molding. In some embodiments, singulation operations are spread over multiple procedures interleaved with other operations, e.g., starting before and ending after other operations. For example, some substrates may be laser scribed before anneal, but not fracture singulated until after anneal and molding operations. In some embodiments, an electrically insulating, packaging material is singulated along with the substrate.

Figure 4D:
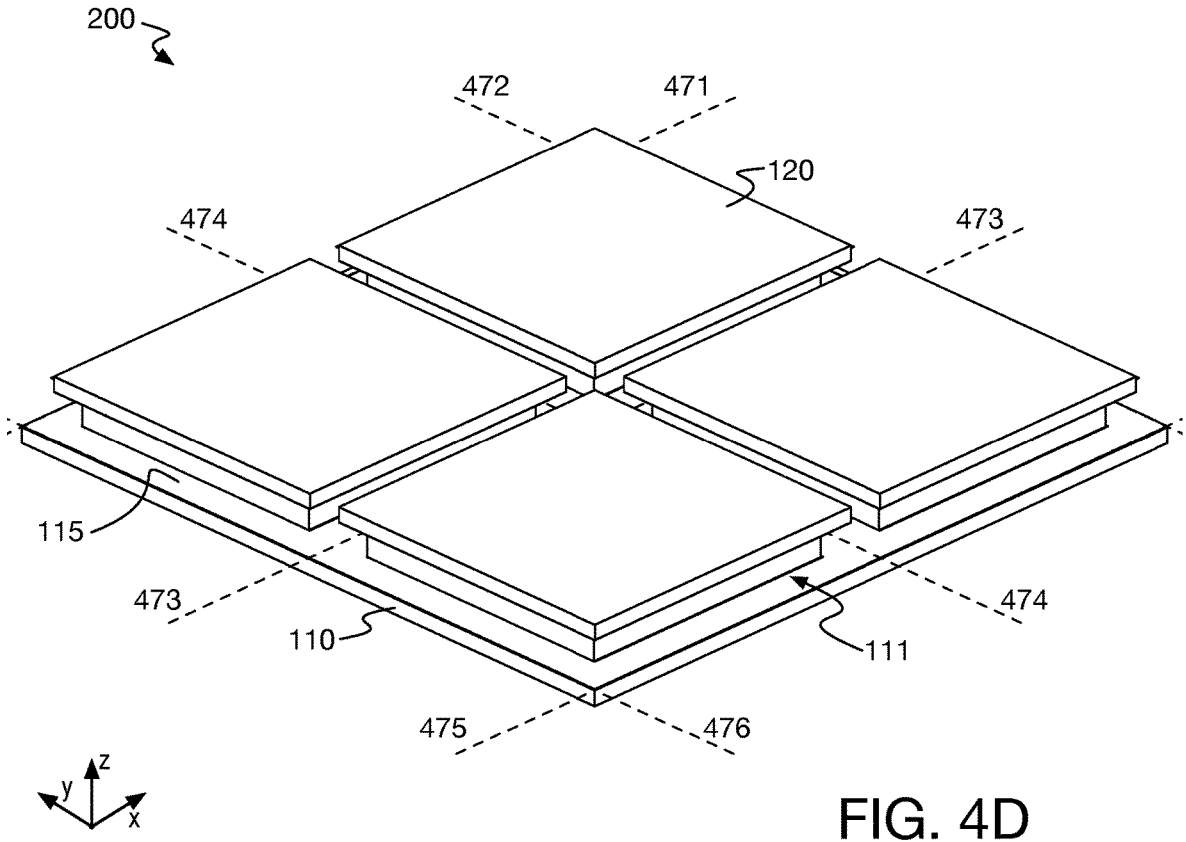

FIG. 4D shows an example multi-chip module 200 with four IC dies 120 bonded to pedestals 111 on substrate 110 following singulation along exterior scribe lines 471, 472, 475, 476 (shown as dashed lines). In other embodiments, substrate 110 could additionally be diced along interior scribe lines 473, 474 to singulate out four smaller IC device packages, each with a single IC die 120 bonded to a portion of substrate 110 including a single pedestal 111. In some embodiments, substrate 110 is diced along only one of interior scribe line 473 or interior scribe line 474 (in addition to exterior scribe lines 471, 472, 475, 476) to singulate out two multi-chip modules 200, each with two IC dies 120 bonded to a portion of substrate 110 including two pedestals 111.

Returning to FIG. 3, a bond strength, e.g., between die and substrate interconnect interfaces, may be further improved by an annealing operation 380. As with bonding operation 360, annealing operation 380 can be influenced by embodiment parameters (e.g., the materials bonded, surface preparations used, etc.) in previous operations. Anneal temperatures may be limited by the material used in, or the structures formed on, substrates and IC dies. Certain anneal operations may be paired with particular cleaning or activation operations.

At packaging operation 390, some or all of the bonded structure of substrate and die, now a multi-chip module, may be, e.g., encapsulated in a package dielectric. A package dielectric is an electrically insulating material that can provide physical and electrical isolation for an IC die, a substrate, or any module components, both between the module components and between module components and external structures and substances. Packaging is not required. For example, the multi-chip module may be coupled to a motherboard and used without, e.g., overmolding. Other downstream operations may be performed without or after packaging and before, e.g., coupling to a host component.

The package dielectric may be deposited over all unbonded surfaces of the multi-chip module, or the package dielectric may be applied selectively on certain portions of an assembly. In some embodiments, a package dielectric covers the IC die and the recessed surface of the substrate. The bottom of the substrate may be left exposed to, e.g., connect to a host component, such as a PCB. In some embodiments, an epoxy is over and adjacent to the unbonded surfaces of the IC die (e.g., the top, sidewalls, and overhanging portions of the bottom), including between the IC die and the recessed surface of the substrate. In some such embodiments, sides of the substrate are covered by epoxy. In other embodiments, sides of the substrate are left exposed. For example, epoxy may be flowed over a substrate not yet fracture singulated from its wafer. The substrate and cured epoxy may be singulated together, which may leave substrate sides uncovered.

Figure 4E:
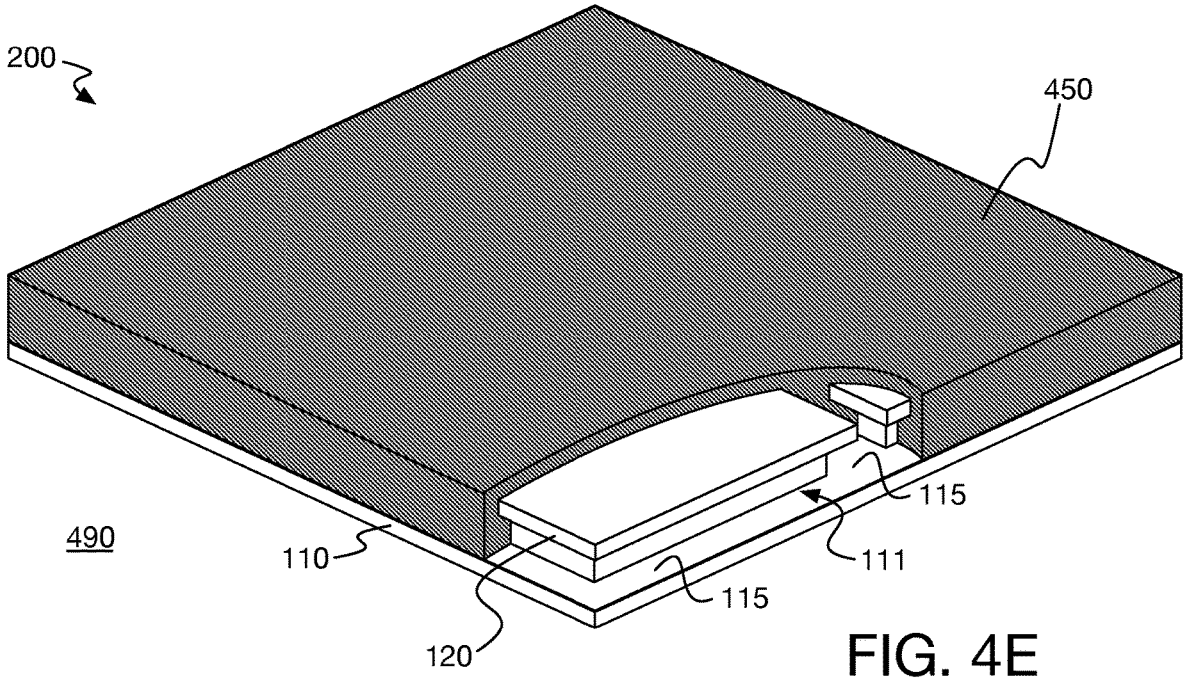

FIG. 4E shows a cutaway view of multi-chip module 200 encapsulated in a package dielectric 450. Package dielectric 450 completely covers IC dies 120. A portion of package dielectric 450 is shown removed at the nearest corner of multi-chip module 200, which exposes visible portions of IC dies 120 bonded to substrate 110 at their respective pedestals 111. The only surfaces of IC dies 120 not adjacent package dielectric 450 are those portions of the bottom surfaces bonded to pedestals 111. Package dielectric 450 is over and adjacent to all IC dies 120 and die sidewalls, including the two partially visible IC dies 120, and between recessed trench surface 115 and each of IC dies 120. Package dielectric 450 does not cover the sides or bottom of substrate 110. In some embodiments, package dielectric 450 covers the sides of substrate 110.

In some embodiments, package dielectric 450 is an epoxy plastic. In some embodiments, package dielectric 450 is a conformal, thermosetting polymer. Many plastics can be used as a package dielectric, including silicones, siloxane polyimide, polyxylylene, polyepoxides, bisbenzocyclo-butene, and cresol-novolaks. In some embodiments, other materials, such as ceramics, form package dielectric 450 and encapsulate multi-chip module 200.

Multi-chip module 200 may be subsequently attached to any host component 490, for example through interconnect interfaces of substrate 110. Host component 490 can be any printed circuit board (PCB). In some examples, host component 490 comprises a power supply, coupled to substrate 110 through host component 490, to power IC dies 120. Multi-chip module 200 may be attached to host component 490 without encapsulating package dielectric 450.

Figure 4F:
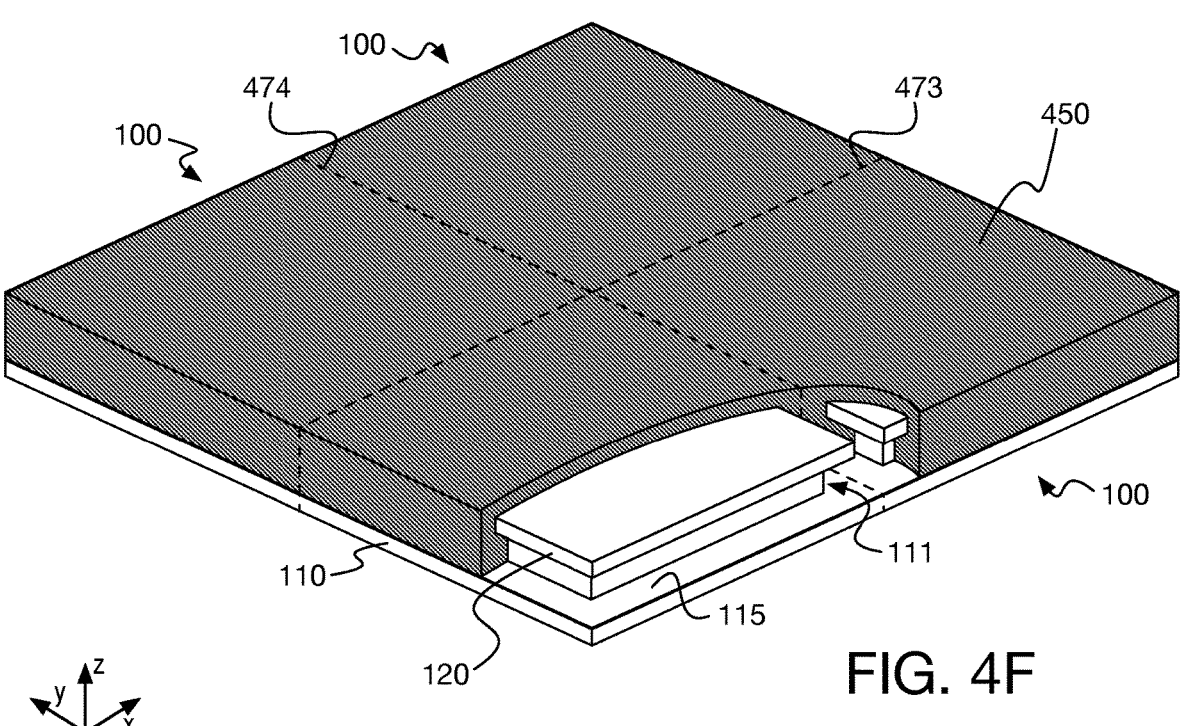

FIG. 4F shows a cutaway view of the same IC dies 120 bonded to substrate 110 at their respective pedestals 111 and encapsulated in a package dielectric 450, but as four separate but adjacent IC devices 100. In some embodiments, the four IC devices 100 are formed identically to multi-chip module 200 of FIG. 4E before being singulated along interior scribe lines 473, 474. In each IC device 100 with a single IC die 120 and substrate 110, package dielectric 450 is over and adjacent to all sidewalls of IC dies 120, and between the various recessed trench surfaces 115 and the respective IC dies 120.

Figure 5:
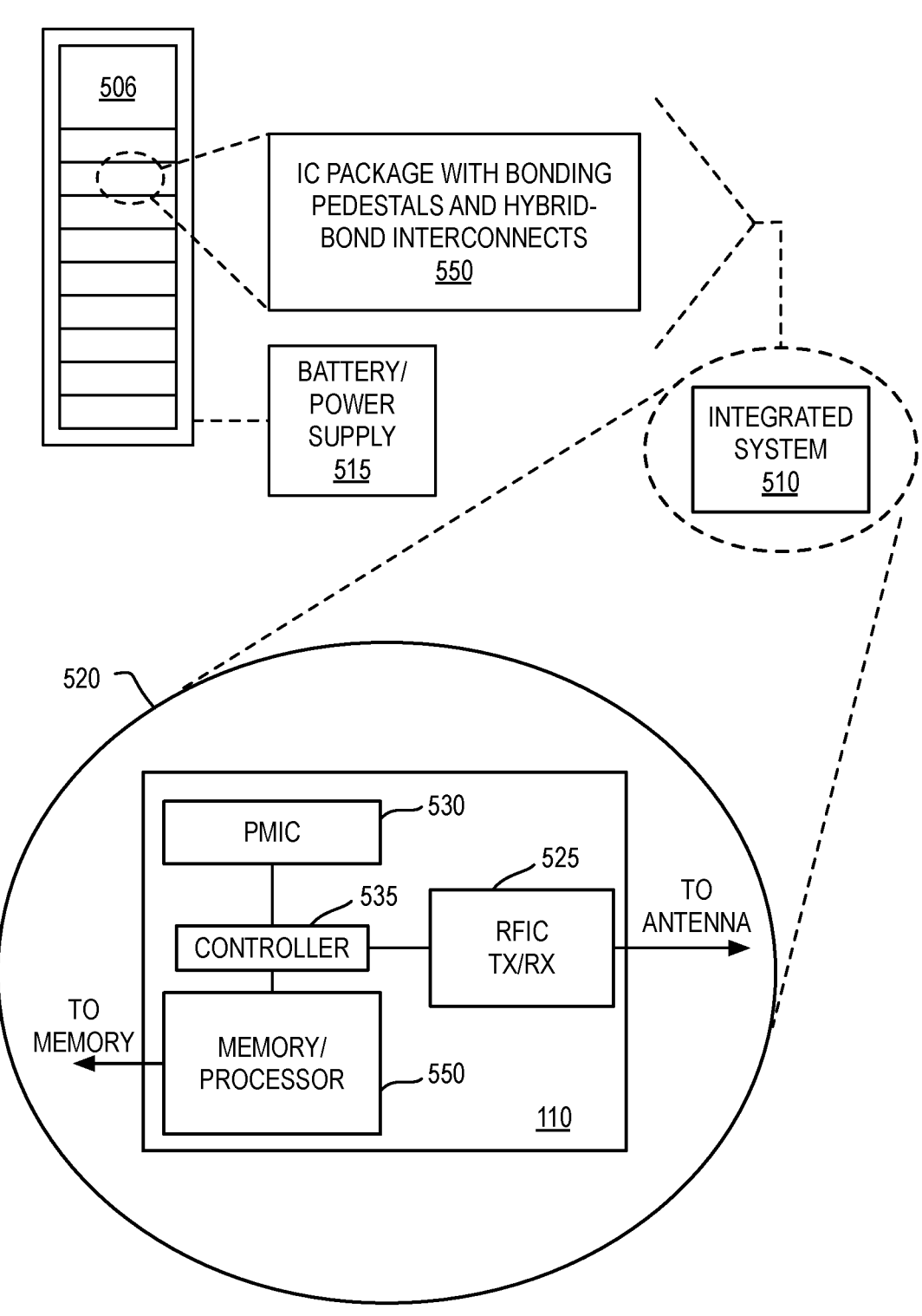
FIG. 5 illustrates a diagram of an example data server machine employing an IC package with a bonding pedestal and hybrid-bond interconnects, in accordance with some embodiments.

FIG. 5 illustrates a diagram of an example data server machine 506 employing an IC package with a bonding pedestal and hybrid-bond interconnects, in accordance with some embodiments. Server machine 506 may be any commercial server, for example, including any number of high-performance computing platforms disposed within a rack and networked together for electronic data processing, which in the exemplary embodiment includes one or more devices 550 having bonding pedestals and hybrid-bond interconnects.

Also as shown, server machine 506 includes a battery and/or power supply 515 to provide power to devices 550, and to provide, in some embodiments, power delivery functions such as power regulation. Devices 550 may be deployed as part of a package-level integrated system 510. Integrated system 510 is further illustrated in the expanded view 520. In the exemplary embodiment, devices 550 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 550 is a microprocessor including an SRAM cache memory. As shown, device 550 may be a multi-chip module employing one or more IC dies on a substrate with bonding pedestals and hybrid-bond interconnects as discussed herein. Device 550 may be further coupled to (e.g., communicatively coupled to) a board, an interposer, or a substrate 110 along with, one or more of a power management IC (PMIC) 530, RF (wireless) IC (RFIC) 525 including a wideband RF (wireless) transmitter and/or receiver (TX/RX) (e.g., including a digital baseband and an analog front end module further comprises a power amplifier on a transmit path and a low noise amplifier on a receive path), and a controller 535 thereof. In some embodiments, RFIC 525, PMIC 530, controller 535, and device 550 include IC dies hybrid bonded to pedestals on substrate 110 in a multi-chip module.

FIG. 6 is a block diagram of an example computing device 600, in accordance with some embodiments. For example, one or more components of computing device 600 may include any of the devices or structures discussed herein. A number of components are illustrated in FIG. 6 as being included in computing device 600, but any one or more of these components may be omitted or duplicated, as suitable for the application. In some embodiments, some or all of the components included in computing device 600 may be attached to one or more printed circuit boards (e.g., a motherboard). In some embodiments, various ones of these components may be fabricated onto a single system-on-a-chip (SoC) die. Additionally, in various embodiments, computing device 600 may not include one or more of the components illustrated in FIG. 6, but computing device 600 may include interface circuitry for coupling to the one or more components. For example, computing device 600 may not include a display device 603, but may include display device interface circuitry (e.g., a connector and driver circuitry) to which display device 603 may be coupled. In another set of examples, computing device 600 may not include an audio output device 604, other output device 605, global positioning system (GPS) device 609, audio input device 610, or other input device 611, but may include audio output device interface circuitry, other output device interface circuitry, GPS device interface circuitry, audio input device interface circuitry, audio input device interface circuitry, to which audio output device 604, other output device 605, GPS device 609, audio input device 610, or other input device 611 may be coupled.

Computing device 600 may include a processing device 601 (e.g., one or more processing devices). As used herein, the term "processing device" or "processor" indicates a device that processes electronic data from registers and/or memory to transform that electronic data into other electronic data that may be stored in registers and/or memory. Processing device 601 may include a memory 621, a communication device 622, a refrigeration device 623, a battery/power regulation device 624, logic 625, interconnects 626 (i.e., optionally including redistribution layers (RDL) or metal-insulator-metal (MIM) devices), a heat regulation device 627, and a hardware security device 628.

Processing device 601 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 600 may include a memory 602, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 602 includes memory that shares a die with processing device 601. This memory may be used as cache memory and may include embedded dynamic random-access memory (eDRAM) or spin transfer torque magnetic random-access memory (STT-M RAM).

Computing device 600 may include a heat regulation/refrigeration device 606. Heat regulation/refrigeration device 606 may maintain processing device 601 (and/or other components of computing device 600) at a predetermined low temperature during operation. This predetermined low temperature may be any temperature discussed herein.

In some embodiments, computing device 600 may include a communication chip 607 (e.g., one or more communication chips). For example, the communication chip 607 may be configured for managing wireless communications for the transfer of data to and from computing device 600. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 607 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 607 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 607 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 607 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 607 may operate in accordance with other wireless protocols in other embodiments. Computing device 600 may include an antenna 613 to facilitate wireless communications and/or to receive other wireless communications (such as AM or FM radio transmissions).

In some embodiments, communication chip 607 may manage wired communications, such as electrical, optical, or any other suitable communication protocols (e.g., the Ethernet). As noted above, communication chip 607 may include multiple communication chips. For instance, a first communication chip 607 may be dedicated to shorter-range wireless communications such as Wi-Fi or Bluetooth, and a second communication chip 607 may be dedicated to longer-range wireless communications such as GPS, EDGE, GPRS, CDMA, WiMAX, LTE, EV-DO, or others. In some embodiments, a first communication chip 607 may be dedicated to wireless communications, and a second communication chip 607 may be dedicated to wired communications.

Computing device 600 may include battery/power circuitry 608. Battery/power circuitry 608 may include one or more energy storage devices (e.g., batteries or capacitors) and/or circuitry for coupling components of computing device 600 to an energy source separate from computing device 600 (e.g., AC line power).

Computing device 600 may include a display device 603 (or corresponding interface circuitry, as discussed above). Display device 603 may include any visual indicators, such as a heads-up display, a computer monitor, a projector, a touchscreen display, a liquid crystal display (LCD), a light-emitting diode display, or a flat panel display, for example.

Computing device 600 may include an audio output device 604 (or corresponding interface circuitry, as discussed above). Audio output device 604 may include any device that generates an audible indicator, such as speakers, headsets, or earbuds, for example.

Computing device 600 may include an audio input device 610 (or corresponding interface circuitry, as discussed above). Audio input device 610 may include any device that generates a signal representative of a sound, such as microphones, microphone arrays, or digital instruments (e.g., instruments having a musical instrument digital interface (MIDI) output).

Computing device 600 may include a GPS device 609 (or corresponding interface circuitry, as discussed above). GPS device 609 may be in communication with a satellite-based system and may receive a location of computing device 600, as known in the art.

Computing device 600 may include other output device 605 (or corresponding interface circuitry, as discussed above). Examples of the other output device 605 may include an audio codec, a video codec, a printer, a wired or wireless transmitter for providing information to other devices, or an additional storage device.

Computing device 600 may include other input device 611 (or corresponding interface circuitry, as discussed above). Examples of the other input device 611 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 600 may include a security interface device 612. Security interface device 612 may include any device that provides security measures for computing device 600 such as intrusion detection, biometric validation, security encode or decode, access list management, malware detection, or spyware detection.

Computing device 600, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-6. The subject matter may be applied to other deposition applications, as well as any appropriate manufacturing application, as will be understood to those skilled in the art.

The following examples pertain to further embodiments, and specifics in the examples may be used anywhere in one or more embodiments.

In one or more first embodiments, an apparatus comprises a substrate comprising a pedestal adjacent to a recessed surface, wherein the pedestal comprises first interconnect interfaces, and an IC die, wherein the IC die comprises second interconnect interfaces in direct contact with the first interconnect interfaces, and the IC die overhangs the recessed surface on at least one side of the pedestal.

In one or more second embodiments, further to the first embodiments, the IC die extends beyond at least two opposite sides of the pedestal.

In one or more third embodiments, further to the first or second embodiments, the IC die has a length, orthogonal to the width, and the length of the IC die is greater than a length of the pedestal, a perimeter of the pedestal is surrounded by the recessed surface, and the IC die extends beyond the perimeter.

In one or more fourth embodiments, further to the first through third embodiments, a package dielectric is over and adjacent to a sidewall of the IC die, and between the recessed surface and the IC die.

In one or more fifth embodiments, further to the first through fourth embodiments, the IC die extends at least 2 µm beyond the side of the pedestal.

In one or more sixth embodiments, further to the first through fifth embodiments, a sidewall of the pedestal has a height from the recessed surface of at least 1 µm.

In one or more seventh embodiments, a system comprises a substrate comprising a first pedestal, a second pedestal, and a recessed surface therebetween, and first and second IC dies, the first IC die comprising interconnect interfaces in direct contact with interconnect interfaces of the first pedestal and the second IC die comprising interconnect interfaces in direct contact with interconnect interfaces of the second pedestal, wherein at least a portion of first IC die extends beyond a sidewall of the first pedestal, and at least a portion of the second IC die extends beyond a sidewall of the second pedestal.

In one or more eighth embodiments, further to the seventh embodiments, the first and second pedestals are spaced apart by a distance and the recessed surface spans the entire distance.

In one or more ninth embodiments, further to the seventh or eighth embodiments, a host component is coupled to the substrate, and a power supply is coupled to the substrate through the host component.

In one or more tenth embodiments, further to the seventh through ninth embodiments, the first IC die has a width greater than that of the first pedestal and the first IC die extends beyond at least two opposite sides of the first pedestal, and the second IC die has a width greater than that of the second pedestal and the second IC die extends beyond at least two opposite sides of the second pedestal.

In one or more eleventh embodiments, further to the seventh through tenth embodiments, the first and second pedestals are surrounded by the recessed surface, and the first and second IC dies overhang the recessed surface on all sides of the first and second pedestals.

In one or more twelfth embodiments, further to the seventh through eleventh embodiments, a lateral width of the recessed surface between the first and second pedestals is not more than 40 µm.

In one or more thirteenth embodiments, further to the seventh through twelfth embodiments, a lateral distance between the first and second IC dies is at least 2 µm.

In one or more fourteenth embodiments, further to the seventh through thirteenth embodiments, a package dielectric is over and adjacent to the first and second IC dies, and between the recessed surface and each of the first and second IC dies.

In one or more fifteenth embodiments, a method comprises receiving a package substrate comprising first interconnect interfaces proud of a recessed surface, receiving an IC die comprising second interconnect interfaces, and bonding the first interconnect interfaces to the second interconnect interfaces, wherein the IC die overhangs the recessed surface.

In one or more sixteenth embodiments, further to the fifteenth embodiments, the method further comprises revealing the recessed surface by etching a portion of the substrate adjacent to the first interconnect interfaces.

In one or more seventeenth embodiments, further to the fifteenth or sixteenth embodiments, revealing said recessed surface comprises masking over the first interconnect interfaces and plasma etching adjacent to the first interconnect interfaces.

In one or more eighteenth embodiments, further to the fifteenth through seventeenth embodiments, the package substrate comprises third interconnect interfaces proud of the recessed surface, the recessed surface is between the first and third interconnect interfaces, and the method further comprises receiving a second IC die, the second IC die comprising fourth interconnect interfaces, and bonding the third interconnect interfaces to the fourth interconnect interfaces.

In one or more nineteenth embodiments, further to the fifteenth through eighteenth embodiments, the method further comprises revealing said recessed surface by etching a portion of the substrate between and adjacent to the first and third interconnect interfaces.

In one or more twentieth embodiments, further to the fifteenth through nineteenth embodiments, the method further comprises covering the IC die and at least a portion of the recessed surface with a package dielectric.

In one or more twentieth embodiments, further to the fifteenth through nineteenth embodiments, the method further comprises covering the IC die and at least a portion of the recessed surface with a package dielectric.

In one or more twenty-first embodiments, further to the fifteenth through twentieth embodiments, the method further comprises laser scribing through the recessed surface.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. An apparatus, comprising:
a substrate comprising a pedestal surrounded by a recessed surface, wherein a bonding surface of the pedestal has the highest elevation of the substrate and comprises a plurality of first metallic interconnect interfaces adjacent to a dielectric material; and
an integrated circuit (IC) die hybrid bonded exclusively to the bonding surface of the pedestal, wherein:
a bonding surface of the IC die comprises a plurality of second metallic interconnect interfaces adjacent to another dielectric material;

each of the second metallic interconnect interfaces is in direct contact with a corresponding one of the first metallic interconnect interfaces and the adjacent dielectric materials are also in direct contact with each other; and a periphery of the IC die beyond the bonding surface of the IC die overhangs the recessed surface on all sides of the pedestal.

2. The apparatus of claim 1, further comprising a package dielectric over and adjacent to a sidewall of the IC die, and between the recessed surface and the periphery of the IC die.

3. The apparatus of claim 1, wherein the periphery of the IC die extends at least 2 µm beyond at least one side of the pedestal.

4. The apparatus of claim 3, wherein a sidewall of the pedestal has a height from the bonding surface of the pedestal to the recessed surface that is at least equal to a length that the periphery of the IC die overhangs all sides of the pedestal.

5. The apparatus of claim 1, wherein the first metallic interconnect interfaces comprise copper and wherein the second metallic interconnect interfaces comprise copper.

6. The apparatus of claim 3, wherein the IC die extends at least 10 µm beyond at least one side of the pedestal.

7. The apparatus of claim 6, wherein the IC die extends at least 15 µm beyond at least one side of the pedestal.

8. A system, comprising:

a substrate, wherein a highest elevation of the substrate comprises a bonding surface of a first pedestal and a bonding surface of a second pedestal, and wherein a recessed surface of the substrate surrounds a perimeter of each of the first and second pedestals, and wherein the bonding surface of each of the first and second pedestals comprises a plurality of first metallic interconnect interfaces and a first dielectric material; and first and second integrated circuit (IC) dies, each one of the IC dies hybrid bonded exclusively to one of the bonding surfaces of a corresponding single one of the first and second pedestals, wherein a bonding surface of each of the first and second IC dies comprises a plurality of second metallic interconnect interfaces in direct contact with the first metallic interconnect interfaces and a second dielectric material in direct contact with the first dielectric material, wherein a peripheral portion of the first IC die beyond the bonding surface of the first IC die extends beyond a sidewall of the first pedestal and overhangs the recessed surface on all sides of the first pedestal, and wherein a peripheral portion of the second IC die beyond the bonding surface of the second IC die extends beyond a sidewall of the second pedestal and overhangs the recessed surface on all sides of the second pedestal.

9. The system of claim 8, wherein the first and second pedestals are spaced apart by a distance and the recessed surface spans an entirety of the distance.

10. The system of claim 8, further comprising:

a host component coupled to the substrate; and a power supply coupled to the substrate through the host component.

11. The system of claim 8, wherein a lateral width of the recessed surface between the first and second pedestals is not more than 40 µm.

12. The system of claim 11, wherein a lateral distance between the first and second IC dies is at least 2 µm.

13. The system of claim 8, further comprising a package dielectric over and adjacent to the first and second IC dies, and between the recessed surface and the peripheral portion of each of the first and second IC dies.

14. The system of claim 8, wherein the first metallic interconnect interfaces of each of the first IC die and the second IC die comprise copper and wherein the second metallic interconnect interfaces of each of the first pedestal and the second pedestal comprise copper.

15. The system of claim 12, wherein the first IC die extends at least 10 µm beyond at least one side of the first pedestal, and wherein the second IC die extends at least 10 µm beyond at least one side of the second pedestal.

16. The system of claim 15, wherein the first IC die extends at least 15 µm beyond at least one side of the first pedestal, and wherein the second IC die extends at least 15 µm beyond at least one side of the second pedestal.

* * * * *